(12) United States Patent
Grodzki

(10) Patent No.: US 10,324,151 B2
(45) Date of Patent: Jun. 18, 2019

(54) MAGNETIC RESONANCE METHOD AND APPARATUS FOR PRODUCING AN IMAGE DATA SET FOR DISPLAY

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 540 days.

(21) Appl. No.: 14/884,821

(22) Filed: Oct. 16, 2015

(65) Prior Publication Data

US 2016/0109547 A1 Apr. 21, 2016

(30) Foreign Application Priority Data

Oct. 16, 2014 (DE) .................. 10 2014 221 054

(51) Int. Cl.
*G01R 33/50* (2006.01)
*G01R 33/54* (2006.01)
*G01R 33/56* (2006.01)

(52) U.S. Cl.
CPC ....... *G01R 33/5602* (2013.01); *G01R 33/546* (2013.01); *G01R 33/5608* (2013.01); *G01R 33/50* (2013.01)

(58) Field of Classification Search
CPC .............. G01R 33/5602; G01R 33/546; G01R 33/5608; G01R 33/50
USPC ................................. 324/300–322
See application file for complete search history.

(56) References Cited

U.S. PATENT DOCUMENTS

| 6,687,527 | B1* | 2/2004 | Wu ...................... | G01R 33/546 324/318 |
| 8,723,518 | B2* | 5/2014 | Seiberlich ............ | G01R 33/543 324/307 |
| 8,781,197 | B2* | 7/2014 | Wang .................... | G01R 33/54 382/131 |
| 9,002,428 | B2* | 4/2015 | Mazer ................... | A61B 5/055 600/410 |
| 9,562,959 | B2* | 2/2017 | Miyazaki ............. | G01R 33/341 |
| 9,633,455 | B1* | 4/2017 | Mailhe ................. | G06T 11/008 |
| 2008/0214933 | A1* | 9/2008 | Von Busch .......... | A61B 5/0059 600/431 |
| 2010/0037182 | A1* | 2/2010 | Biglieri ................. | G01R 33/54 715/849 |
| 2010/0172560 | A1* | 7/2010 | Kimmlingen ........ | G01R 33/243 382/131 |
| 2011/0044524 | A1* | 2/2011 | Wang .................... | G01R 33/54 382/131 |

(Continued)

OTHER PUBLICATIONS

Ma et al., "Magnetic resonance fingerprinting," Nature, vol. 495, No. 7440, pp. 187-192 (2013).

(Continued)

*Primary Examiner* — Patrick Assouad
*Assistant Examiner* — Sean Curtis
(74) *Attorney, Agent, or Firm* — Schiff Hardin LLP

(57) ABSTRACT

In a method for generating an image data set for display, magnetic resonance data of a patient are provided to a computer that contains parameters of the protons underlying the measured magnetic resonance signal in measured voxels. The image data set is generated dependent on at least one user specification, taking into consideration at least two parameters per voxel.

13 Claims, 1 Drawing Sheet

(56) References Cited

U.S. PATENT DOCUMENTS

| | | | | |
|---|---|---|---|---|
| 2011/0237859 | A1* | 9/2011 | Kuhn | A61N 5/1031 |
| | | | | 600/1 |
| 2012/0197105 | A1* | 8/2012 | Mezer | A61B 5/055 |
| | | | | 600/410 |
| 2012/0224757 | A1* | 9/2012 | Gross | G01R 33/56563 |
| | | | | 382/131 |
| 2012/0235678 | A1* | 9/2012 | Seiberlich | G01R 33/56 |
| | | | | 324/307 |
| 2014/0062476 | A1* | 3/2014 | Miyazaki | G01R 33/341 |
| | | | | 324/309 |
| 2014/0292325 | A1* | 10/2014 | Heule | G01R 33/448 |
| | | | | 324/309 |
| 2015/0301141 | A1* | 10/2015 | Griswold | G01R 33/5608 |
| | | | | 382/131 |
| 2015/0366484 | A1* | 12/2015 | Grodzki | A61B 5/055 |
| | | | | 600/420 |
| 2016/0033604 | A1* | 2/2016 | Grodzki | G01R 33/4828 |
| | | | | 324/309 |
| 2016/0059041 | A1* | 3/2016 | Grodzki | A61N 5/1071 |
| | | | | 600/411 |
| 2016/0109547 | A1* | 4/2016 | Grodzki | G01R 33/5602 |
| | | | | 324/309 |
| 2016/0139227 | A1* | 5/2016 | Grodzki | G01R 33/5608 |
| | | | | 324/309 |
| 2016/0154078 | A1* | 6/2016 | Grodzki | G01R 33/50 |
| | | | | 324/309 |
| 2016/0292855 | A1* | 10/2016 | Metzger | G06T 7/0012 |
| 2017/0315200 | A1* | 11/2017 | Kiefer | G01R 33/4828 |
| 2018/0017647 | A9* | 1/2018 | Yablonskiy | G01R 33/246 |

OTHER PUBLICATIONS

Weiskopf et al., "Estimating the apparent transverse relaxation time (R2*) from images with different contrasts (ESTATICS) reduces motion artifacts," Frontiers in Neuroscience, vol. 8, Article 278, pp. 1-10 (2014).

Weiskopf et al., "Quantitative multi-parameter mapping of R1, PD*, MT, and R2* at 3T: a multi-center validation," Frontiers in Neuroscience, vol. 7, Article 95, pp. 1-11 (2013).

* cited by examiner

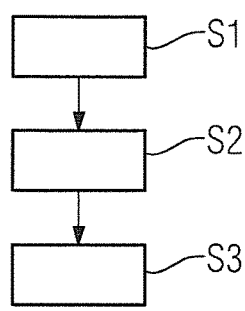
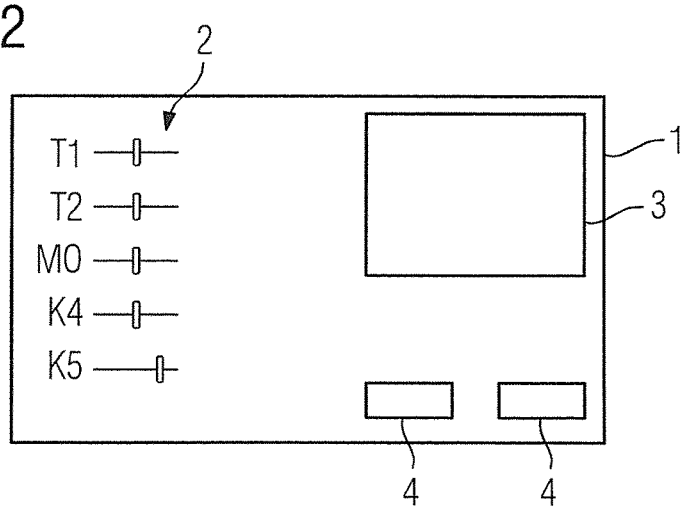
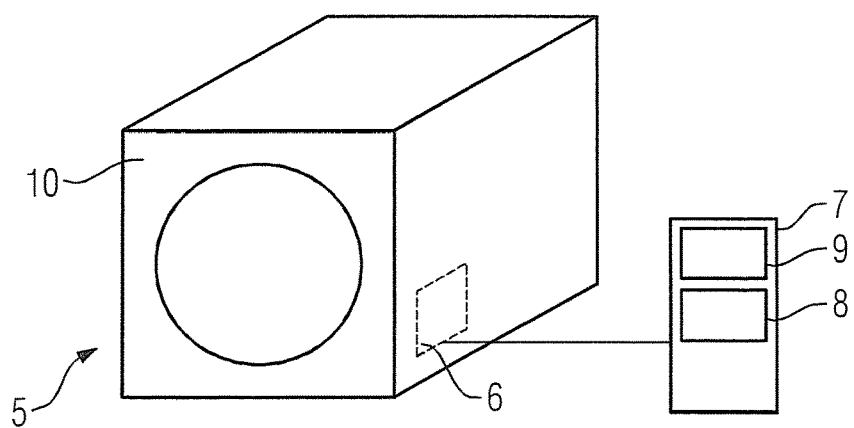

MAGNETIC RESONANCE METHOD AND APPARATUS FOR PRODUCING AN IMAGE DATA SET FOR DISPLAY

BACKGROUND OF THE INVENTION

Field of the Invention

The invention concerns a method for producing a magnetic resonance image data set of a patient, for display, which quantitatively contains parameters of the protons underlying the detected magnetic resonance signal in the measured voxels. The invention also concerns a computer and a storage medium encoded with programming instructions for implementing such a method.

Description of the Prior Art

Magnetic resonance imaging has become an established investigation modality, in particular in medical diagnosis. This examination method modality is advantageous due to the high soft tissue contrast that can be achieved. In clinical imaging, magnetic resonance scans usually provide only a qualitative contrast, because magnetic resonance data of the individual voxels are subject to many influences. Although some of these influences can be controlled by the user, for example, inserting the recording parameters of the magnetic resonance protocol, in particular echo time, repetition time, bandwidth and the like, there are also factors that cannot be influenced by the user, for example coil sensitivities, software versions, as well as the type of magnetic resonance device and its manufacturer.

Since quantitative magnetic resonance data are desirable for a multiplicity of applications, methods were known for describing the parameters of protons in the measured voxels from which the magnetic resonance signals originate. Such "genuine" physical parameters are, for example, T1 relaxation time, T2 relaxation time, deviations from the homogeneity of the basic magnetic field ("off resonances"), proton densities and the like. One quantitative magnetic resonance measurement method of note is so-called magnetic resonance fingerprinting, which is described in an article by Dan Ma et al., "Magnetic Resonance Fingerprinting", Nature, 2013, 495 (7440), pages 187-192. There the production of a large number of images, for example 1000 to 5000 images, is proposed by pseudorandomized processes of different recording parameters, in particular of the flip angle, the repetition time, the echo time and the inversion time. From this a specific signal path, which is described as a "fingerprint", can be produced pixel-by-pixel and this can, in turn, be assigned one-to-one to a specific n-tuple of physical values (parameters) with the use of a database so that in particular it is also possible to identify individual substances, for example cerebral spinal fluid (CSF), gray cerebral matter and the like.

The parameters that are quantitatively present in such magnetic resonance data may be displayed, for example, as so-called "maps", such as a T1 map, T2 map and the like. A problem with such a display, however, is that such quantitative magnetic resonance maps are unfamiliar for the radiologist who creates the findings, because his or her experience in diagnosis is based on different representations. In addition, individual quantitative parameters alone are not suitable for contrasting an area of interest significantly enough in the context of other anatomical structures.

SUMMARY OF THE INVENTION

An object of the present invention is to provide an improved basis for diagnostic assessment for quantitative magnetic resonance measurements.

This object is achieved by a method of the type described above wherein, according to the invention, the image data set is ascertained for at least one user specification by taking into consideration at least two parameters per voxel.

According to the invention automatic functionality that can be realized by a computer, and/or a computer program is provided to derive additional magnetic resonance images, which may favor and/or accelerate assessment by a user, from quantitative magnetic resonance data sets. The simplified preparation of a multiplicity of image data sets from a single quantitative magnetic resonance data set is therefore implemented, since in the final analysis the user must only give one specification, whereupon the quantitative information present as parameters in the magnetic resonance data can be appropriately combined to enable visualization in the form of the image data set, which supports further assessment by the user. Preferably, a user interface is provided via which a user can interactively change the specifications and update his or her preferences. The present invention therefore makes it possible to reconstruct a "conventional" magnetic resonance image from a quantitative magnetic resonance data set as, for example, can be recorded with a known magnetic resonance sequence and a known magnetic resonance protocol. When such a known qualitative magnetic resonance image known from the past is created as an image data set, the user can again draw on his or her extensive experience with such magnetic resonance images so that an improved assessment is provided. However, the method according to the invention also enables the derivation of novel image data sets enabling an improved diagnosis that, for example, are optimized with regard to certain contrast requirements and the like, as explained in more detail below.

Preferably a T1 relaxation time, a T2 relaxation time, a parameter describing the basic field inhomogeneity in the voxel ("off-resonance"), and bias are used as parameters for the voxel. These four variables are sufficient to describe the basic reaction under the influence of the magnetic fields of the recording magnetic resonance device and therefore provide an excellent basis. While the relaxation times and bias (MO) in the voxels that are exposed to the magnetic fields of the magnetic resonance device are known as basic principles, deviation from inhomogeneity (off-resonance) also plays a crucial role for various reasons. The off-resonances maybe described, for example, by T2* relaxation times. Taking off-resonances into account is particularly useful when image data sets are to be derived in the form of "conventional" magnetic resonance images, because certain fluctuations and lighter image artifacts are ultimately also expected by the user. It should be noted, however, that embodiments of the invention are also conceivable in which only some of these four basic parameters are used.

The magnetic resonance data may naturally also contain additional parameters besides the underlying parameters, for example a parameter describing the transfer of magnetization and/or a parameter describing diffusion. Generally speaking, the magnetic resonance data can be recorded using a magnetic resonance fingerprinting method, for example. It is further noted that the multiplicity of magnetic resonance images that are used to create the "fingerprint", are scanned at frequencies that are too low, or are generally recorded with poorer, non-diagnostic quality, in order to be able to limit the duration of measurement; such images are therefore not suitable for use as image data sets for making a medical diagnosis.

The user specification may correspond to a magnetic resonance protocol and/or weighting for at least some of the parameters and/or intermediate data derived from them and/or an indication of an area of a desired high contrast composed of a number of voxels, together with an indication of the type of contrast. Various options are feasible, which can be realized via various operating modes using a user interface or, for example, in a shared operating mask. For example, magnetic resonance protocols, to which, the appearance of the image data set should correspond, may be selected from a list, or a creation module may be used in addition in the context of the method according to the invention for magnetic resonance protocols. In such a creation module echo times, repetition times, magnetic resonance sequences and the like are selected, for example. It is also feasible to enter a magnetic resonance protocol as an input. Besides the magnetic resonance sequence, such a magnetic resonance protocol includes, as is known, additional adjustable variables such as the repetition time (TR), the echo time (TE), the bandwidth and the like.

In connection with the adjustment of weightings, slide controls may be advantageously displayed in the user interface, for example an individual slide control respectively for each of the parameters for the voxels contained in the magnetic resonance data, which can also be highlighted appropriately, such as with textual components such as "T1 weighting strong" and "T1 weighting weak". It is also conceivable to include intermediate data in the weighting, for example in the context of simulation of a result of intermediate data derived from a magnetic resonance protocol and the like. For example, it is feasible to provide predetermined magnetic resonance protocols for different magnetic resonance sequences, for which intermediate data sets are generated as a matter of principle, which can be included in the image data set with a specific weighting. For example, breakdown according to sequence type is feasible, for example TSE, GRE, TrueFISP and the like.

A third option for the method according to the invention provides for the selection of an area recorded in the magnetic resonance data, as a specification. This selected area therefore includes at least two voxels in which the contrast is to be optimized so that ultimately an optimum image data set can be created. For example, the aim may be to display a tumor as clearly and distinctly as possible. For this purpose, a tool may be provided in the user interface to mark the area in which the strongest contrast is to be shown. It is also conceivable, for example, to select two points in the volume described by the magnetic resonance data which are intended to provide a particularly strong contrast in the image data set. Optionally, in addition to the selection of the area, a type of desired contrast may be selected, for example T1 contrast, T2 contrast, susceptibility weighting (SWI) and the like.

Depending on which user specifications exist and if necessary also, which mode of operation is selected, the image data set may be generated in different ways, it also being possible to combine the different types.

Thus it is conceivable for the image data set and/or an intermediate data set, for ascertaining the image data set that must be taken into account, to be ascertained by simulation of a magnetic resonance imaging process on the basis of a magnetic resonance protocol present as a specification or ascertained in an optimization method for achieving optimum contrast in the area intended as the user specification. For example, if the user specification relates to a particular magnetic resonance protocol, on the basis of the existing parameters underlying the measured magnetic resonance signal in the context of simulation, an image data set can be created that corresponds to a magnetic resonance image recorded with this magnetic resonance protocol. The use of simulations need not necessarily be restricted to user specifications of magnetic resonance protocols. It is also feasible to create intermediate data sets that are included in ascertaining the final image data set, whether the image data sets are included in a weighting procedure (that will be discussed in more detail below), or in a subsequent optimization process. Making the magnetic resonance protocol itself the subject of optimization is also conceivable, particularly if greater contrast is desired in a certain area. In such an embodiment, for example, recording parameters defining the magnetic resonance protocol can be varied until maximum contrast is obtained in the area. In this way, a manner of "automatic protocol optimization for a selected area" is achieved in the context of known optimization methods. The result is then an image data set that, for example, provides the greatest possible contrast in the selected area or between selected places in the recorded volume. Within the context of such an optimization process, consideration can also be given as to whether a contrast preference is selected, for example whether a T1 contrast is required in the area. In principle, it is also conceivable to use such an optimized magnetic resonance protocol to record new magnetic resonance data.

Furthermore, it may be stipulated that, in order to ascertain the image data set a fusion takes place of cards resulting from the parameters and/or at least one intermediate data set. Such a fusion can be described by a weighting determined by the user specification and/or ascertained in an optimization method. Therefore, a weighted superimposition of the parameters of the magnetic resonance data is possible if a weighting is available for these as a specification. In addition, this superimposition may be supplemented by intermediate data sets to which a weighting value may also be assigned, for example via the aforementioned slide control of a user interface. Intermediate data sets created by simulation, for example, are suitable as intermediate data sets for different types of magnetic resonance sequences, as already explained. Ultimately, the user therefore has the option of superimposing different parameter maps, ultimately therefore, for example, of combining contrasts and the like, which can be supplemented by simulated intermediate data sets. However, it is also possible to automatically ascertain weighting values for the parameter maps and if necessary intermediate data sets in an optimization method, for example, if a desire for maximum contrast in an area is specified as a user specification. In this connection, the above-described optimization methods for the simulation are applicable so that overall the optimization method may be aimed at achieving optimum contrast in the area intended as a user specification.

For this reason, however, three different operating modes are conceivable with the different embodiments described to which, for example, an individual user interface may be assigned. In a first operating mode the user may, as described, enter a magnetic resonance protocol of a conventional magnetic resonance examination as a user specification, whereupon the set examination is simulated and dependent on the parameters, a synthetic magnetic resonance image is determined as an image data set. In such an operating mode, it is also possible to reconstruct the image data set as often as the user wishes so that, for example, it is possible to test which magnetic resonance image would have been produced with a longer echo time or the like. This then makes it possible, for example, to describe or identify a pathology more clearly for a diagnostic assessment.

In a second operating mode, slide controls for the measured quantitative parameters may be made available to the user. At the same time the current image data set, which is produced by weighted superimposition of the corresponding cards for the parameters, can already be displayed in a window ideally displayed simultaneously with the slide controls. Depending on the adjustment of the slide control of the measured parameter and/or of the measured contrast, the standardized quantitative card is weighted more weakly or strongly (naturally it also makes sense generally in this context to standardize the cards with regard to the range of values to enable meaningful superimposition). If intermediate data sets are available, additional slide controls may be provided which, for example, permit the weighting of types of magnetic resonance sequences or the like.

A third operating mode, which may in turn be assigned an individual user interface, may be used to select an area in which maximum contrast is desired. If necessary, operating elements may also be provided in order to select the type of contrast desired. By simulations and/or optimized weighting, as described, the image data set which has the greatest contrast in the selected area can then be ascertained and displayed.

It should be noted that the performance of a simulation is preferably based on Bloch equations, as is known. The most diverse simulation methods may be used, wherein it is also naturally feasible to calculate the Bloch equations in full and to use the corresponding result, wherein if necessary other effects and/or influences of the magnetic resonance device may additionally be simulated by filters. Other simulation methods, for example finite element methods and the like, may naturally also be used.

In an embodiment of the present invention, in order to allow alteration and/or initial adjustment of user specifications, a preview image with reduced resolution is generated and displayed before generating the image data set. A manner of "preview window" with reduced resolution may therefore be created in which real-time updating can take place when the specifications are changed, which is particularly useful if the specifications relate to optimization methods and/or simulations which may take a long time to calculate, if not working with a significantly reduced resolution, and therefore individual voxels of magnetic resonance data are combined to form larger voxels.

It may be useful to provide an option to export created image data sets, in particular to save these as files or in databases and the like.

In addition to the method, the invention also concerns a computer or computing system, in particular as part of magnetic resonance apparatus, which is designed for performance of the method according to the invention. All embodiments with regard to the method according to the invention apply analogously to the computer according to the invention, so that the aforementioned advantages may also be obtained with such a computer. The computer may be designed, for example, as the control computer of magnetic resonance apparatus or as part of such a control computer. Naturally, it is also possible to realize the method according to the invention at an image editing workplace, for example, a workstation, or to even incorporate it into an image archiving system (PACS).

The invention also encompasses a non-transitory, computer-readable data storage medium encoded with programming instructions. When the storage medium is loaded into a computer, the programming instructions cause the computer to implement the method as described above, as the programming instructions are executed by the computer. The storage medium may be, for example, a CD-ROM.

BRIEF DESCRIPTION OF THE DRAWINGS

FIG. 1 is a flowchart of the method according to the invention.

FIG. 2 shows an embodiment of a user interface suitable for use in the method according to the invention.

FIG. 3 schematically illustrates a magnetic resonance apparatus for implementing the method according to the invention.

DESCRIPTION OF THE PREFERRED EMBODIMENTS

FIG. 1 shows a flowchart of an exemplary embodiment of the method according to the invention.

The starting point for the method according to the invention is a magnetic resonance data set in which, for each voxel of the volume represented by the data set, underlying parameters of the protons in the respective voxel and, if appropriate, additional parameters are assigned to the measured magnetic resonance signal. The magnetic resonance data set was acquired in a magnetic resonance scanner wherein a basic magnetic field is generated which may not be perfectly homogenous. In this case the parameters are a T1 relaxation time, a T2 relaxation time, a parameter describing the basic magnetic field inhomogeneity in the voxels (off-resonance), and bias for the voxels; optionally a transfer of magnetization and a parameter describing diffusion can be used as additional parameters. The transfer of magnetization describes interactions between the spins of adjacent voxels. Therefore parameter maps of the volume for each parameter can be generated from the magnetic resonance data set which relates to a certain patient. These parameter maps may also be displayed and assessed accordingly by a user.

Such parameter maps are not always ideal for making a diagnosis, and the experience of many users draws on "conventional", qualitative resonance images that are recorded with particular magnetic resonance protocols using a particular magnetic resonance sequence. It is therefore the aim of the exemplary embodiment of the method according to the invention to derive additional image data sets for display from the magnetic resonance data, wherein a multiplicity, preferably all, of the aforementioned parameters are taken into account.

For the image data sets to be created, the user may specify different specifications that may result in the image data set being ascertained differently, for which reason the exemplary embodiment of the method according to the invention provides three operating modes, of which one is selected in step S1 by the user. In all the operating modes, on a display device of the computer that performs the method, user interfaces are displayed in which the specifications can be made. The specifications are different for each of the operating modes. Nonetheless, the additional procedure can be abstracted in such a way that in a step S2 the user specification is accepted and in a step S3 the image data set is ascertained. All three operating modes likewise have in common that, in step S2, initially a preview image is generated, if possible in real time, for the current specifications in order to provide the user with an initial impression of his or her selection. This preview image is created so as to have significantly lower resolution than the image data set. Only after final confirmation of the specifications that were selected in the respective user interface is the image data set ascertained in full resolution in step S3. In this case, following the voxel structure that is prescribed by the magnetic resonance data set.

In the first operating mode, the image data set should be ascertained as if it were recorded with a particular magnetic resonance protocol, therefore with a particular magnetic resonance sequence and for particular additional recording parameters, in particular therefore an echo time, a repetition time, a bandwidth and the like. Therefore, in step S2 in the first operating mode the user is provided with a user interface via which he can input a magnetic resonance protocol, select it from a list or even recreate it in an input option used before the recording of magnetic resonance images. If the computing device is a control device of a magnetic resonance device or part of such a control device, corresponding resources available anyway, which involve the creation of magnetic resonance protocols, may be used by the user interface.

If a magnetic resonance protocol was compiled, in step S3 a simulation of the image recording process is performed using Bloch equations, which is possible without any problems because the parameters per voxel are available in the magnetic resonance data, and the recording parameters are specified by the magnetic resonance protocol. The result of such a simulation is a synthetic magnetic resonance image as an image data set that appears as if the magnetic resonance protocol had been used for the corresponding volume of the patient.

In a second operating mode, a weighted superimposition of the parameter maps of the individual parameters should be enabled, wherein optionally in the corresponding user interface intermediate data sets relating to particular magnetic resonance sequences may also be connected. These intermediate data sets may be ascertained, for example, by means of simulation, as described, using predefined magnetic resonance protocols. Weighting values for the individual parameters and if necessary, magnetic resonance sequences may be adjusted via slide controls which are displayed in the user interface. Based on the weighting values available as user specifications, the image data set is created by merging the corresponding parameter maps and if necessary, the intermediate image data sets, in this case in total by means of weighted superimposition. The parameter maps and intermediate data sets can have been standardized in order to enable superimposition immediately. After superimposition takes place in real time, in this operating mode a constant interplay of steps S2 and S3 may ultimately take place, as the result of changing the user specification is immediately apparent to the user.

To provide a better illustration, a user interface 1 of the second operating mode is shown in a diagrammatic illustration in FIG. 2. Evidently correspondingly identified slide controls 2 are provided for the parameters, and enable adjustment of the weighting. In a preview window 3, a preview of the image data set for the current user specification of the weighting values can be seen. Additional operating elements 4 may, for example, be provided to change the operating mode, for final ascertainment of the image data set, for exporting the image data set and/or for additional functions.

In a third operating mode, an area comprising at least two voxels in which the contrast is to be maximized is defined. To this end, in step S2 for example, one of the parameter maps or an intermediate data set may be displayed in the user interface, so that marks may be made therein by the user. For example, an area containing an abnormality may be marked. It is also feasible to select two particular places, in other words two voxels, in order to maximize the contrast between these two voxels. Other versions are also feasible in order to define an area of interest, for optimization in terms of the contrast, of the volume recorded in the magnetic resonance data.

As an additional option, in the user interface in the third operating mode the user may also select preferred contrasting in which the contrast is to be created, for example T1 contrast, T2 contrast or the like, or weight different types of contrast.

In step S3 in the third operating mode an optimization method is then used to determine the image data set with the optimum contrast in the area. This may take place on the basis of simulation, wherein ultimately an optimum magnetic resonance protocol is then determined, from which the image data set with the optimum contrast is obtained as a result of the simulation. Optimization of the weighting values is also conceivable, cf. for this the second operating mode, or a combination of both optimization procedures, wherein conventional optimization methods known from the prior art may be used in each case.

Regardless of the operating mode in which the image data set is created, it may naturally be exported, for example, as a file or saved in a database, displayed on a display device and the like.

FIG. 3 shows a schematic sketch of a magnetic resonance device 5, the control computer 6 of which is designed (configured) for performance of the method according to the invention. For this purpose the control computer 6 is connected to a control terminal 7 that has an input device 8 for acceptance of the user specifications and a display device 9, in particular a screen, for display of the user interfaces and the image data set. The control terminal 7 need not necessarily be provided as part of the scanner 10, but may be arranged externally thereof.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating an image data set or display, comprising:

providing a computer with magnetic resonance data acquired from a subject, said magnetic resonance data qualitatively containing parameters of protons from which magnetic resonance signals, represented by said magnetic resonance data, originated in voxels of the subject;

dependent on at least one user specification provided to the computer, automatically generating, in said computer, an image data set comprised of a plurality of voxels using at least two of said parameters to generate each voxel in the plurality of voxels comprising the image data set instead of generating said image data set by transformation of said magnetic resonance signals, so as to give said image data set generated from said at least two of said parameters a visual appearance corresponding to a visual appearance of an image data set generated by said transformation of said magnetic resonance signals; and making the generated image data available from the computer, as a data file, in an electronic form for display of the generated image data set.

2. A method as claimed in claim 1 wherein said magnetic resonance data were obtained by operation of a magnetic resonance scanner in which a basic magnetic field was generated, and wherein said parameters are selected from the group consisting of T1 relaxation time, T2 relaxation time, a parameter describing a field inhomogeneity of said basic magnetic field in each voxel, and a parameter describing a bias of said basic magnetic field in each voxel.

3. A method as claimed in claim 1 wherein said magnetic resonance data were obtained by operation of a magnetic resonance scanner in which a basic magnetic field was generated, and wherein said parameters are selected from the group consisting of T1 relaxation time, T2 relaxation time, a parameter describing a field inhomogeneity of said basic magnetic field in each voxel, and a parameter describing a bias of said basic magnetic field in each voxel, and a parameter describing a transfer of magnetization between protons in each voxel, and a parameter describing diffusion in each voxel.

4. A method as claimed in claim 1 comprising selecting said user specification from the group consisting of a magnetic resonance protocol, a weighting for at least some of said parameters, intermediate data derived from a weighting of at least some of said parameters, and a designation of an area of desired high contrast comprising a plurality of voxels.

5. A method as claimed in claim 1 comprising selecting said user specification from the group consisting of a magnetic resonance protocol, a weighting for at least some of said parameters, intermediate data derived from a weighting of at least some of said parameters, and a designation of an area of desired high contrast comprising a plurality of voxels together with an indication of a type of said contrast.

6. A method as claimed in claim 1 comprising generating said image data set for an intermediate data set from which said each data set is then generated, by a simulation in said computer of a magnetic resonance imaging procedure based on a magnetic resonance protocol.

7. A method as claimed in claim 6 comprising using, as said magnetic resonance protocol, a magnetic resonance protocol designed to optimize contrast in a designated area that is designated by a user entry into the computer.

8. A method as claimed in claim 1 comprising generating said image data set as a fusion of respective maps resulting from said parameters, with said cards being weighted by respective weightings.

9. A method as claimed in claim 8 comprising producing said weighting by a user specification, or by execution of an optimization method in said computer, or from an intermediate data set generated in said computer.

10. A method as claimed in claim 9 comprising performing said optimization method to optimize contrast in a designated area designated by a user entry into the computer.

11. A method as claimed in claim 1 comprising, in said computer, generating a preview image with a resolution that is reduced compared to said image data set, and displaying said preview image at a display in communication with said computer, before generating said image data set.

12. A magnetic resonance apparatus comprising:

a magnetic resonance scanner;

a computer provided with magnetic resonance data acquired from a subject by operation of said magnetic resonance scanner, said magnetic resonance data qualitatively containing parameters of protons from which magnetic resonance signals, represented by said magnetic resonance data, originated in voxels of the subject;

dependent on at least one user specification provided to the computer, said computer being configured to automatically generate an image data set comprised of a plurality of voxels using at least two of said parameters per voxel in the plurality of voxels comprising the image data set instead of generating said image data set by transformation of said magnetic resonance signals, so as to give said image data set generated from said at least two of said parameters a visual appearance corresponding to a visual appearance of an image data set generated by said transformation of said magnetic resonance signals; and said computer being configured to make the generated image data available from the computer, as a data file, in an electronic form for display of the generated image data set.

13. A non-transitory, computer-readable data storage medium encoded with programming instructions, said storage medium being loaded into a computer and said programming instructions causing said computer to:

receive magnetic resonance data acquired from a subject, said magnetic resonance data qualitatively containing parameters of protons from which magnetic resonance signals, represented by said magnetic resonance data, originated in voxels of the subject;

dependent on at least one user specification provided to the computer, automatically generate an image data set comprised of a plurality of voxels using at least two of said parameters per voxel in the plurality of voxels comprising the image data set instead of generating said image data set by transformation of said magnetic resonance signals, so as to give said image data set generated from said at least two of said parameters a visual appearance corresponding to a visual appearance of an image data set generated by said transformation of said magnetic resonance signals; and make the generated image data available from the computer, as a data file, in an electronic form for display of the generated image data set.

\* \* \* \* \*